(12) United States Patent
Bendinelli et al.

(10) Patent No.: US 11,337,088 B2
(45) Date of Patent: May 17, 2022

(54) TEST APPARATUS FOR A TELECOMMUNICATION NETWORK, AND METHOD FOR TESTING A TELECOMMUNICATION NETWORK

(71) Applicant: KEYSIGHT TECHNOLOGIES SINGAPORE (SALES) PTE. LTD., Singapore (SG)

(72) Inventors: Enrico Bendinelli, Monza (IT); Paolo Angelo Maria Marini, Sauze d'Olux (IT)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/765,517

(22) PCT Filed: Dec. 28, 2018

(86) PCT No.: PCT/IB2018/060701
§ 371 (c)(1),
(2) Date: May 20, 2020

(87) PCT Pub. No.: WO2019/130267
PCT Pub. Date: Jul. 4, 2019

(65) Prior Publication Data
US 2020/0322819 A1    Oct. 8, 2020

(30) Foreign Application Priority Data
Dec. 29, 2017   (IT) .................. 102017000151175

(51) Int. Cl.
*G01R 29/08*    (2006.01)
*G01R 29/10*    (2006.01)
(Continued)

(52) U.S. Cl.
CPC ........ *H04W 24/06* (2013.01); *G01R 29/0821* (2013.01); *G01R 29/105* (2013.01);
(Continued)

(58) Field of Classification Search
CPC .......... G01R 29/02–26; H04B 7/02–12; H04B 17/0082–3913; H04W 16/28;
(Continued)

(56) References Cited

U.S. PATENT DOCUMENTS

| 2010/0120415 A1 | 5/2010 | Urquhart et al. |
| 2016/0226640 A1 | 8/2016 | Seol et al. |

(Continued)

FOREIGN PATENT DOCUMENTS

| EP | 2063676 A1 | 5/2009 |
| EP | 2182764 A1 | 5/2010 |

OTHER PUBLICATIONS

International Search Report for PCT No. PCT/1 B2018/060701 dated Dec. 28, 2018, 11 pgs.

*Primary Examiner* — Timothy J Weidner

(57) ABSTRACT

A test apparatus includes: a communication interface for connection to a enodeb of a mobile telecommunication network provided with beamforming functionality, the communication interface being configured to receive communication traffic between the enodeb and a mobile terminal coupled in communication to the enodeb (3); a beamforming-testing unit, configured to receive communication-channel-quality signals (RSRPS) corresponding to each communication beam (B1, B2, . . . , BN), the communication-channel-quality signals (RSRPS) representing a signal power received by the mobile terminal. The beamforming-testing unit checks whether communication settings of the enodeb in relation to selection of the communication beams (Continued)

(B1, B2, ..., BN) are consistent with the communication-channel-quality signals (RSRPS).

15 Claims, 8 Drawing Sheets

(51) Int. Cl.

| | |
|---|---|
| *H04B 7/0408* | (2017.01) |
| *H04B 7/06* | (2006.01) |
| *H04B 17/318* | (2015.01) |
| *H04B 17/391* | (2015.01) |
| *H04W 16/28* | (2009.01) |
| *H04W 24/06* | (2009.01) |
| *H04W 24/08* | (2009.01) |
| *H04W 24/10* | (2009.01) |
| *H04W 84/04* | (2009.01) |
| *H04W 88/18* | (2009.01) |
| *H04W 92/12* | (2009.01) |

(52) U.S. Cl.
CPC ......... *H04B 7/0408* (2013.01); *H04B 7/0695* (2013.01); *H04B 17/318* (2015.01); *H04B 17/3912* (2015.01); *H04W 16/28* (2013.01); *H04W 24/08* (2013.01); *H04W 24/10* (2013.01); *H04W 84/042* (2013.01); *H04W 88/18* (2013.01); *H04W 92/12* (2013.01)

(58) Field of Classification Search
CPC . H04W 24/02–10; H04W 72/04–0473; H04W 84/02–16; H04W 88/12–188; H04W 92/02; H04W 92/04; H04W 92/10; H04W 92/12

See application file for complete search history.

(56) References Cited

U.S. PATENT DOCUMENTS

2018/0375593 A1* 12/2018 Elfstrom ............... H04B 17/101
2019/0058535 A1* 2/2019 Karajani ............ H04B 17/0085
2020/0099458 A1* 3/2020 Leather .................. H04B 17/12

* cited by examiner

TEST APPARATUS FOR A TELECOMMUNICATION NETWORK, AND METHOD FOR TESTING A TELECOMMUNICATION NETWORK

CROSS-REFERENCE TO RELATED APPLICATIONS

This application is the U.S. National Phase application under 35 U.S.C. § 371 of International Application No. PCT/IB2018/060701, filed on Dec. 28, 2018, which claims priority from Italian Patent Application No. 102017000151175 filed on Dec. 29, 2017. Priority is claimed under 35 U.S.C. 119 to both International Application No. PCT/M2018/060701 and Italian Patent Application No. 102017000151175. The entire disclosures of International Application No. PCT/IB2018/060701 and Italian Patent Application No. 102017000151175 are both incorporated herein by reference in their entirety.

TECHNICAL FIELD

The present invention relates to a test apparatus for testing a telecommunication network and to a method for testing a telecommunication network.

BACKGROUND

As is known, in the last few years, the telecommunication industry has improved implementation of 4G LTE (Long-Term Evolution) networks in order to increase the capacity of data transmission by operating on various fronts, in particular by improving spectral efficiency, installing a larger number of radio base stations (BTS, Base Transceiver Stations), and exploiting the aggregation of a number of carriers, even on different bands. Even though many improvements have been achieved—such as the increase in the MIMO (Multiple Input Multiple Output) order, a higher-order modulation, heterogeneous networks (HetNets), a massive carrier aggregation (CA), and a co-ordinated multipoint (CoMP)—, none of these has, however, afforded a supplementary traffic capacity sufficient to sustain the performances required by the 5G system foreseen in years to come.

Some innovative and effective solutions for creating 5G communication systems envisage exploitation of very high frequencies, which are normally under-utilized, such as the millimetric-wavelength (mmW, Millimeter Wave) bands. Chiefly, these frequencies are exploited for point-to-point direct connections with high-directionality and high-gain antennas on account of the high propagation losses, of the problems posed by the presence of obstacles along the direct path, and of the lack of availability of components at low costs.

The currently most promising solutions, however, envisage enhancing the transmission capacity by exploiting space-division access procedures in combination with time-division access procedures. For this purpose, so-called beamforming techniques may be used. Beamforming techniques are based upon the use of arrays of antennas that transmit one and the same signal from different points. The phase of the signal transmitted by each antenna is controlled so as to generate constructive interferences in selected directions and destructive interferences elsewhere. In practice, through the beamforming techniques, it is possible to shape the beams transmitted so as to enhance directionality thereof, enabling a radio base station to simultaneously communicate with different terminals on the same frequency bands, but on distinct areas of the cell served.

If, however, on the one hand the transmission capacity is in principle increased, on the other new problems arise as regards management of the data traffic and checking of whether the connections are correct. In particular, considering the complexity of the operations and the latencies that have to be accepted on account of the huge amount of traffic to be handled, there are concrete possibilities of there arising errors in selection and in the use of the directions to be employed. In other words, it may happen that the procedures for agreeing upon the use of a beam (i.e., basically a direction) between a radio base station and a mobile terminal fail. In other situations, transmission of the radio base station may not follow the outcome of the above procedures; i.e., beams different from the ones agreed upon may be used, or the time windows for use of the beams selected may not be respected. In all these cases, communication between the radio base station and the mobile terminal may be hindered or in any case rendered inefficient. It would hence be necessary to have available tools that, in the testing stage, enable detection of errors in assignment and in use of transmission beams by the systems for control and management of the radio base stations.

BRIEF DESCRIPTION OF THE DRAWINGS

The present invention will now be described with reference to the annexed drawings, which illustrate some non-limiting examples of embodiment thereof, in which.

DETAILED DESCRIPTION

Figure 1:
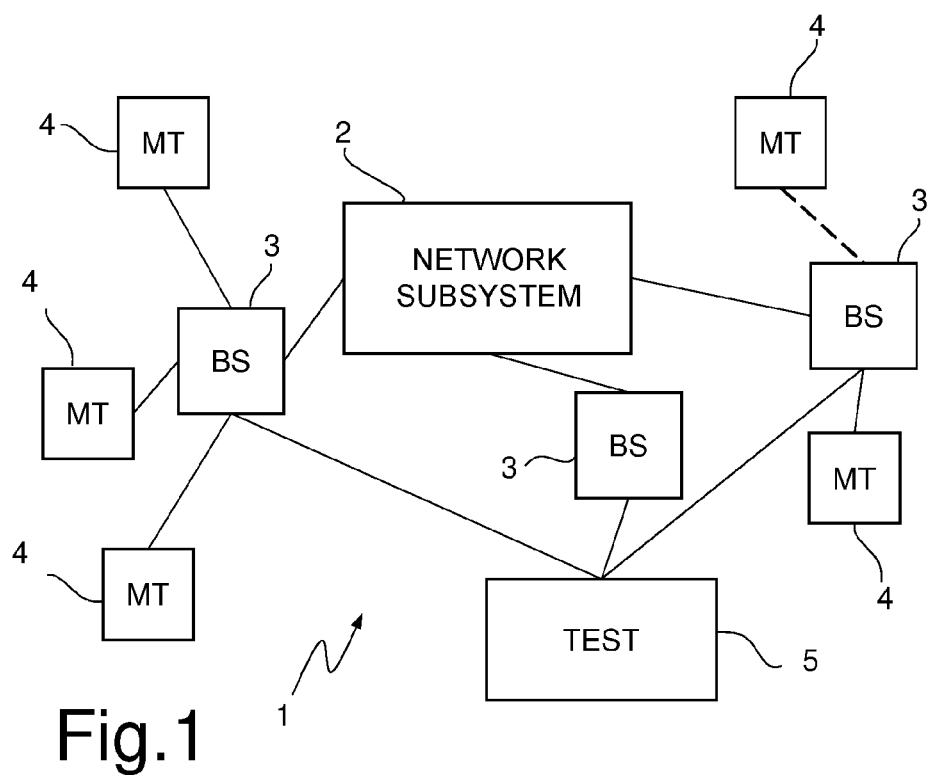
FIG. 1 is a simplified block diagram of a mobile telecommunication network.

FIG. 1 shows in a simplified way a telecommunication network 1 according to an embodiment of the present invention. The telecommunication network 1 is an FDMA (Frequency-Division Multiple Access) mobile telecommunication network, or else a TDMA (Time-Division Multiple Access) mobile telecommunication network. In one embodiment, for example, the telecommunication network 1 is a network based upon OFDM (Orthogonal-Frequency—Division Multiplexing) technology or SC-FDMA (Single-Carrier—Frequency-Division Multiple Access) technology, in particular an LTE or 5G New Radio network, or evolutions thereof. The telecommunication network 1 comprises a network subsystem 2, a plurality of radio base stations or eNodeBs 3, and a plurality of mobile terminals 4. Here and in the following, by "mobile telecommunication system" we mean a telecommunication system in which at least coupling between the mobile terminals and a network infrastructure is provided by radiofrequency connection.

In the example described herein, the network infrastructure, to which the mobile terminals 4 can be connected, is defined by the network subsystem 2 and by the eNodeBs 3, which are permanently connected to the network subsystem 2. In particular, the mobile terminals 4 can activate a connection through one of the eNodeBs 3, selected so as to optimise signal transmission and reception according to modalities set by the standard implemented. FIG. 1 moreover shows a test apparatus 5, connected to at least one of the eNodeBs 3 in order to carry out testing of functionality of the telecommunication network 1 or of a part thereof.

Figure 2:
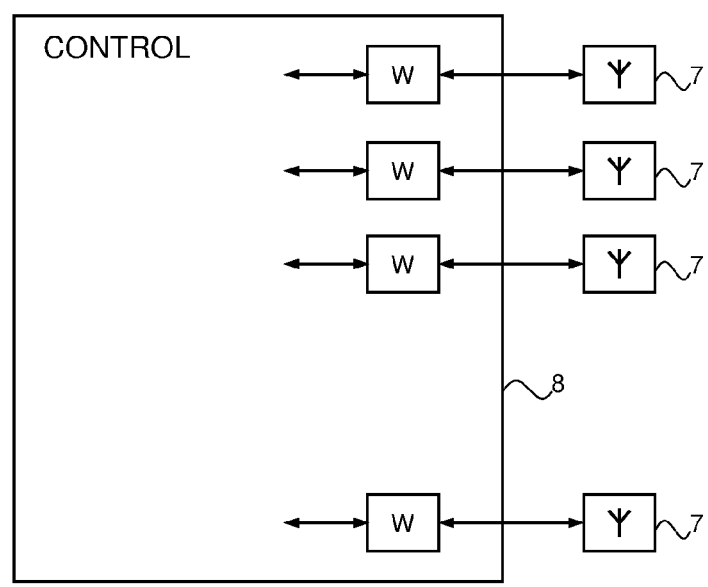
FIG. 2 is a simplified block diagram of a control apparatus of the mobile telecommunication network of FIG. 1.
Figure 3:
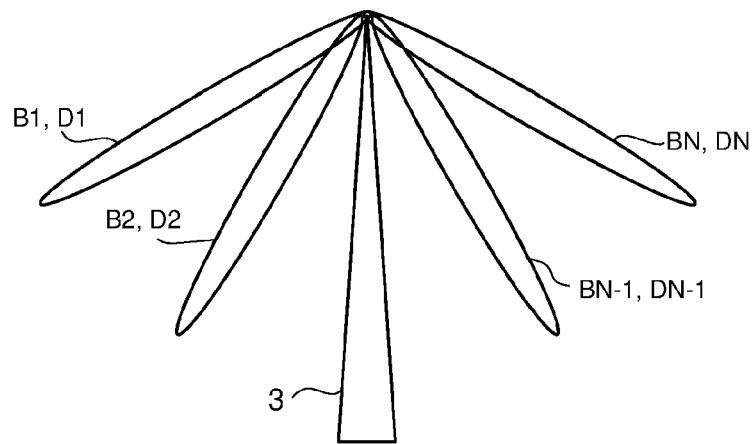
FIG. 3 schematically illustrates a node of the network of FIG. 1 with beamforming capacity.

At least some of the eNodeBs 3 are configured to use beamforming techniques in transmission and reception. As illustrated by way of example in FIG. 2, an eNodeB 3 that uses beamforming comprises an array of antennas 7 and a control apparatus 8, which calculates and applies respective weights W to the antennas 7. The weights W define, in transmission, the phase delays with which the respective antennas 7 transmit one and the same signal or, in reception, the delays of the instants of sampling of the signals received by the respective antennas 7. The weights W are selected so as to generate constructive interferences in given directions of transmission and reception, and destructive interference elsewhere. By varying the weights W, the control apparatus 8 can arbitrarily modify the direction of transmission and reception of the array of antennas 7. In practice, through beamforming techniques, it is possible to shape the communication beams B1, B2, . . . , BN (FIG. 3) so as to enhance the directionality thereof, thus enabling simultaneous communication between an eNodeB 3 and different terminals on the same frequency bands, but on distinct areas of the cell served. Each communication beam B is identified by a respective direction of transmission D1, D2, . . . , DN.

Figure 4:
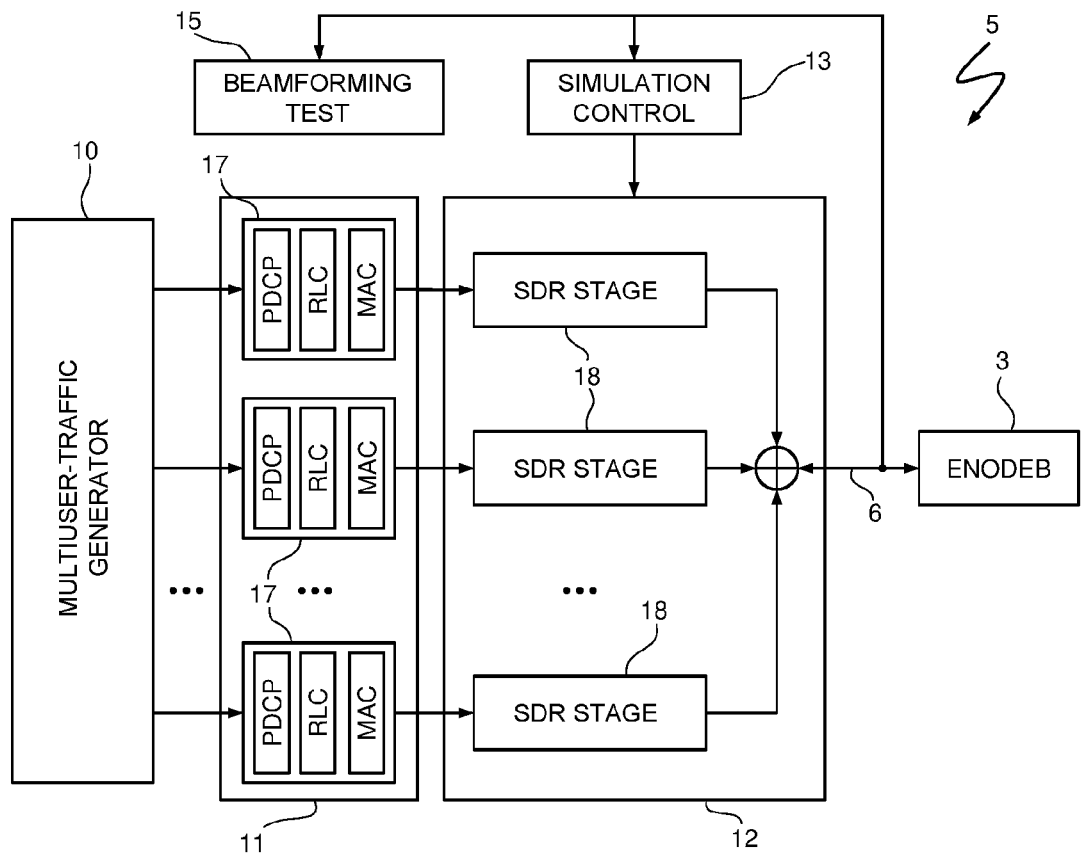
FIG. 4 is a simplified block diagram of a test apparatus for a telecommunication network according to an embodiment of the present invention, which can be used in the mobile telecommunication network of FIG. 1.

FIG. 4 shows in greater detail the test apparatus 5 coupled in communication with an eNodeB 3 with capacity for using the beamforming technique. In the embodiment of FIG. 4, communication between the test apparatus 5 and the eNodeB 3 is established in base band, for example through a communication interface comprising a base-band connection over optical fibre 6.

The test apparatus 5 enables simulation of a population of mobile terminals coupled in communication with the eNodeB 3 under test. In an embodiment, the test apparatus 5 comprises a multiuser—traffic generator 10, a protocol—simulation unit 11, a physical-layer—simulation unit 12, a simulation-control unit 13, and a beamforming-testing unit 15. The multiuser-traffic generator 10 produces simulated traffic corresponding to a population of simulated mobile terminals. The generated traffic simulates traffic in the form of voice, data, and video content that could be transmitted and received by a population of real mobile terminals connected to the eNodeB 3 under test.

The protocol-simulation unit 11 is programmable and is configured to create a plurality of state machines that implement specific protocol stacks for a given mobile telecommunication standard used in the telecommunication network 1, for example an LTE or 5G standard. More precisely, a protocol stack is defined by a set of state machines that implement respective protocol layers. The protocol-simulation unit 11 is configured to implement as many different protocol-stack instances 17 as are the mobile terminals simulated by the test apparatus 5. In addition, the protocol-simulation unit 11 is configured to implement one or more instances of protocol-stack instances 17 for different telecommunication standards. In this way, the protocol-simulation unit 11 is able to simulate the behaviour of different mobile terminals based upon one and the same standard or upon different standards and connected to a portion of the telecommunication network 1 under test. Each protocol-stack instance 17 generated comprises a MAC (Medium-Access Control) layer, an RLC (Radio-Link Control) layer, and a PDCP (Packet-Data Control Protocol) layer.

The physical-layer-simulation unit 12 is configured to define a plurality of SDR (Software-Defined Radio) modules 18, which:
    carry out the conversion of the bitstream generated by the multiuser-traffic generator 10 into symbols, according to the modulation scheme used (for example BPSK, 16QAM, 64QAM); and
    carry out, on the basis of the sequences of symbols to be transmitted, amplitude and phase modulation of subcarriers assigned to the simulated mobile terminals.

In one embodiment, the physical-layer-simulation unit 12 may be configured to simulate mutual interference between the population of simulated mobile terminals.

The simulation-control unit 13 has direct access to the O&M (Operation & Maintenance) control signals, which it uses for the functional checks on the individual simulated mobile terminals, in particular with reference to correctness and congruence in the use of the radio resources.

The beamforming-testing unit 15 checks that the communication beams B1, B2, . . . , BN are used correctly. In particular, the beamforming-testing unit 15 extracts information on management of the communication beams B1, B2, . . . , BN by the O&M control signals and receives communication-channel-quality signals from the protocol-stack instances 17 associated with the simulated mobile terminals. The information received by the beamforming testing-unit is used to check the congruence of the communication settings of the simulated mobile terminals and of the eNodeB 3 in relation to the communication beams B1, B2, . . . , BN, i.e., to check whether the communication beams B1, B2, . . . , BN effectively used correspond to the communication settings negotiated.

Figure 5:
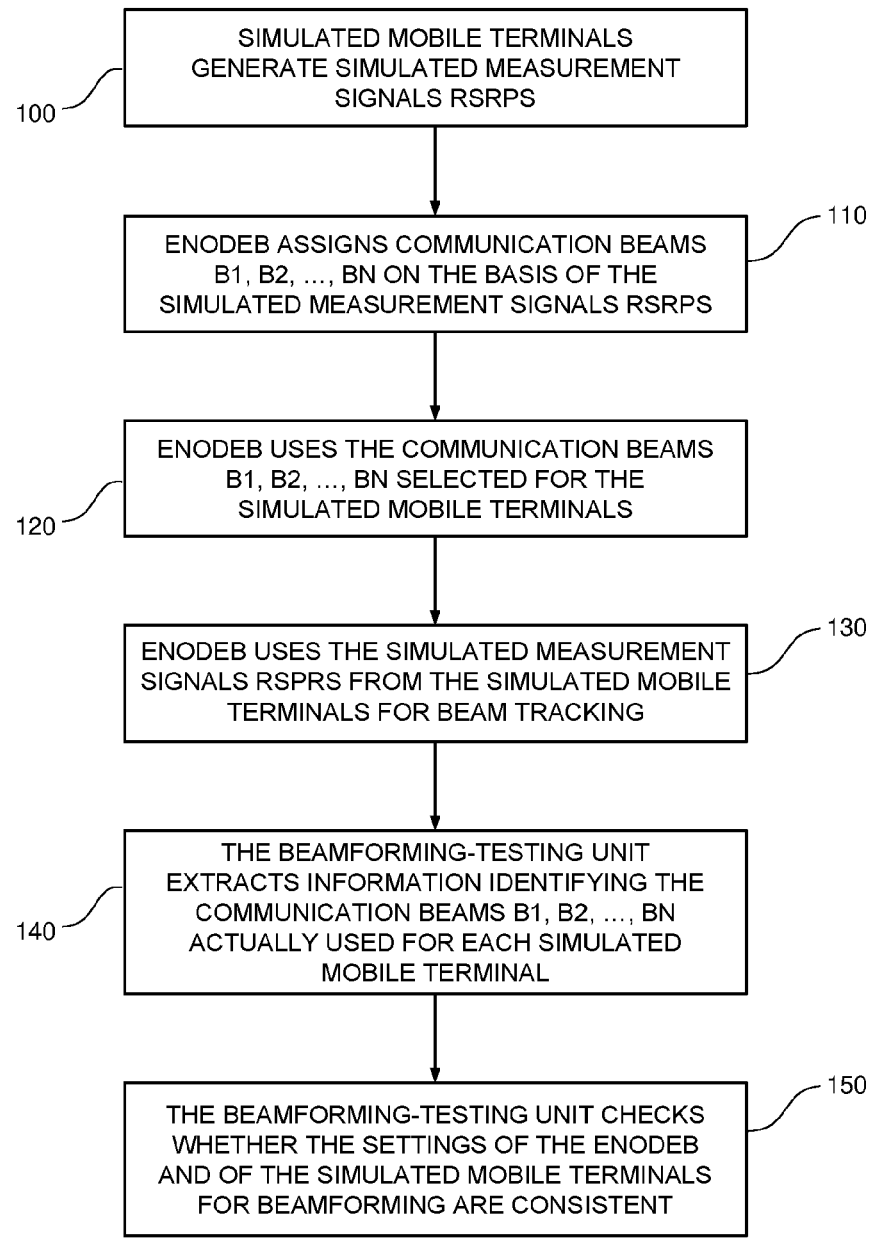
FIG. 5 is a flowchart representing operation of the test apparatus of FIG. 4.
Figure 6:
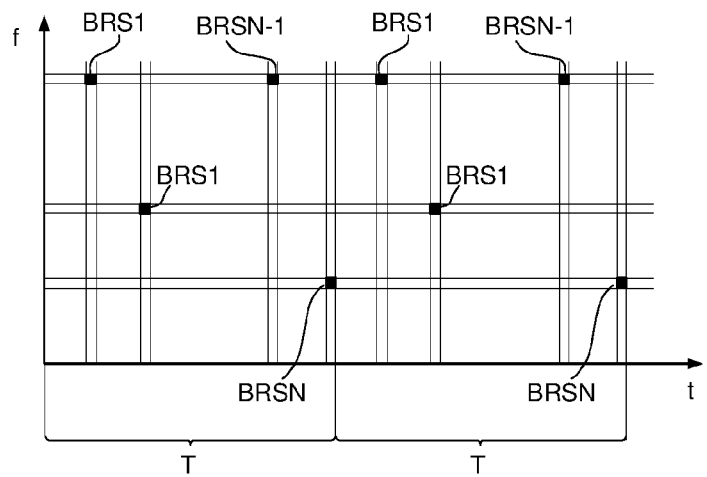
FIG. 6 is a graph representing quantities used by the mobile telecommunication network of FIG. 1.

In one embodiment, the beamforming-testing unit 15 carries out an active check according to the procedure described hereinafter with reference to FIG. 5. The simulated mobile terminals instantiated in the test apparatus 5 generate and send respective communication-channel-quality signals, for example simulated measurement signals RSRPS (where RSRP stands for "Reference-Signal Received Power", and S stands for "Simulated") for each communication beam B1, B2, . . . , BN (block 100). In general, communication-channel-quality signals are signals defined in each communication standard and provide an indication of the quality of the connection between a mobile terminal and an eNodeB. In what follows, constant reference will be made to real or simulated RSRP (Reference—Signal Received Power) signals, without, however, this implying any limitation. For instance, as an alternative to the RSRP signals, indicators may be used such as CSI (Channel State Information). In wireless communications, the indicator CSI describes how a signal propagates from the transmitter to the receiver and represents the combined effect, for example, of scattering, fading, and power decay with distance. The method for determining CSI indicator is also referred to as "channel estimation". The CSI index makes it possible to adapt the transmissions to the current channel conditions, this being fundamental for obtaining reliable communications with high data-transmission rates in multi-antenna systems. An RSRP signal is generated by a real mobile terminal and provides an indication of the power signal received by the mobile terminal and, consequently, of the reception quality. The RSRP signals may be vectors N of measurement values, one for each communication beam B1, B2, ..., BN. Measurement of received power is performed on a reference signal. In greater detail, in the case where the eNodeB 3 has beamforming capacity, associated with each communication beam B1, B2, ..., BN is a respective beam-reference signal BRS1, BRS2, ..., BRSN, which is periodically transmitted by the eNodeB 3 with an assigned and fixed position in the time-frequency frame structure, i.e., in a respective resource block assigned and defined by a respective dedicated time interval, repeated cyclically, and by a respective dedicated band. In other words, with reference to FIG. 6, the beam-reference signals BRS1, BRS2, ..., BRSN are transmitted periodically and are identified by the combination of the respective time interval in the period and by the respective frequency band, which are purposely reserved. Identification of the communication beam B1, B2, ..., BN to which each beam-reference signal BRS1, BRS2, ..., BRSN is associated may be based upon the combination of the time interval in the period and of the respective frequency sub-band, without any need for transmission of an identifier (implicit identification of the communication beams B1, B2, ..., BN). In alternative embodiments, however, an identifier may be used instead of or in addition to the combination of time interval in the period and in the sub-band (explicit identification of the communication beams B1, B2, ..., BN).

Each measurement value of the signals RSRP represents the power of a respective beam-reference signal BRS1, BRS2, ..., BRSN, be detectable at the mobile terminal and corresponds to a respective communication beam B1, B2, ..., BN. In the example described, the simulated measurement signals RSRPS are signals having fictitious values and correspond to simulated measurements generated by the test apparatus 5.

The simulated measurement signals RSRPS are encoded and sent to the eNodeB 3 by radio-resource-management messages. For simplicity, in what follows reference will continue to be made exclusively to the simulated measurement signals RSRPS. It is understood, however, that in the transmission by each (real or simulated) mobile terminal to the eNodeB, the information corresponding to the simulated measurement signals RSRPS are carried by radio-resource-management messages and that the eNodeB extracts this information from the radio-resource-management messages received. The eNodeB 3 assigns to each simulated mobile terminal a respective communication beam B1, B2, ..., BN on the basis of the measurement values of the respective simulated measurement signals RSRPS (block 110). More precisely, the eNodeB 3 selects, for each simulated measurement signal RSRPS from among the ones transmitted by the simulated mobile terminals, a measurement value on the basis of a mechanism of selection of the communication standard used (for example, the measurement value that indicates the maximum signal power received) and assigns the corresponding communication beam B1, B2, ..., BN to the transmitting simulated mobile terminal. The most favourable direction of communication D1, D2, ..., DN for each simulated mobile terminal is thus selected.

The eNodeB 3 starts transmission by using the communication beams B1, B2, ..., BN selected for the various simulated mobile terminals (block 120).

Selection of the communication direction may, however, fail for various reasons linked to problems or errors in the software of the eNodeB 3, which can be triggered by events and conditions such as the size of the population of mobile terminals in the cell served by the eNodeB 3, the latencies, the disturbance on the transmission channel, and the interference between mobile terminals. In these cases, the communication beams B1, B2, ..., BN selected may not correspond to the optimal RSRP signals transmitted by the mobile terminals.

After the eNodeB 3 has started transmission on the selected beams, the test apparatus 5 continues to supply the simulated measurement signals RSRPS for the active communication beam B1, B2, ..., BN of each simulated mobile terminal, and the eNodeB 3 uses the simulated measurement signals RSRPS received for beam tracking (block 130).

The simulation-control unit 13 and the beamforming-testing unit 15 receive from the eNodeB 3 the O&M control signals between the BBU (Base-Band Unit) and the RRH (Remote Radio Head) of the eNodeB 3 and extract information that identifies the communication beams B1, B2, ..., BN effectively used for each simulated mobile terminal (block 140). The beamforming-testing unit 15 uses the O&M control signals between the BBU and the RRH of the eNodeB 3 to check that the transmission settings of the eNodeB 3 as regards selection of the communication beam B1, B2, ..., BN are consistent with the current communication settings of the simulated mobile terminals (block 150). In practice, the beamforming-testing unit 15 checks that the selection made by the eNodeB 3 is in line with the result expected on the basis of the mechanism of selection of the communication standard used and of the simulated measurement signals RSRPS supplied (for example, on the basis of the measurement value that, in the simulated measurement signals RSRPS, indicates the communication beam B1, B2, ..., BN with the best reception quality).

Figure 7:
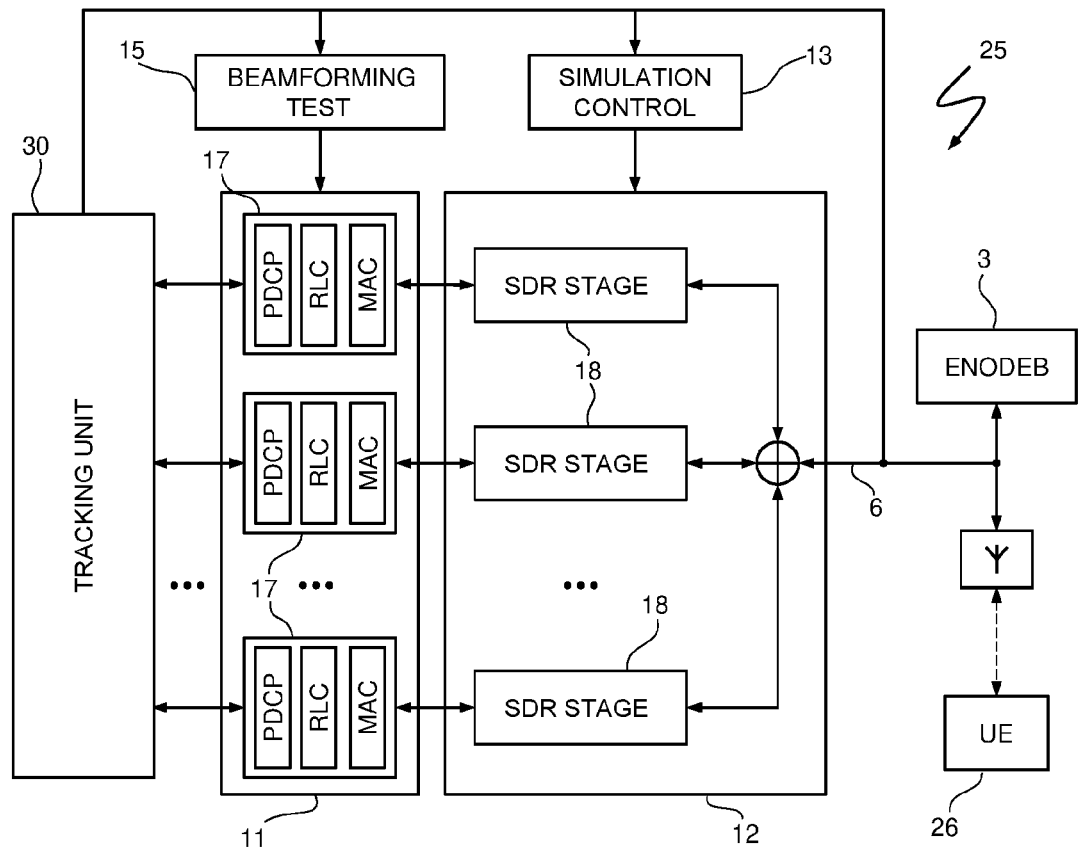
FIG. 7 is a simplified block diagram of a test apparatus for a telecommunication network according to a different embodiment of the present invention, which can be used in the mobile telecommunication network of FIG. 1.

In a different embodiment of the invention (illustrated in FIG. 7), the test apparatus, here designated by the number 25, is configured to check proper operation of the eNodeB 3 as regards beamforming functionality, during communication with a real mobile terminal 26 in a known position, and operates in reception mode.

The test apparatus 25 has a structure similar to the test apparatus 5 already described and comprises the protocol-simulation unit 11, the physical-layer-simulation unit 12, the simulation-control unit 13, and the beamforming-testing unit 15. Moreover, the test apparatus 25 comprises a tracking unit 30, instead of the multiuser-traffic generator 10 or in addition thereto. Also in this case, the test apparatus 25 is coupled to the eNodeB 3 through a base-band connection over optical fibre 6. However, instead of using simulated traffic, the apparatus uses real traffic transmitted and received between the eNodeB 3 and a real mobile terminal 26 (or more than one), which communicate over a radio connection.

Thanks to the decoding carried out by the protocol-simulation unit 11, the tracking unit 30 stores the measurements made, in particular real measurement signals RSRPR sent by the real mobile terminal 26, and the information identifying the communication beams B1, B2, ..., BN that is drawn from the O&M control signals of the eNodeB 3 that regard beamforming functionality. In this case, the real measurement signals RSRPR are generated during the beam-acquisition procedure effectively carried out by the real mobile terminal 26. Checking of whether assignment and use of the communication beams B1, B2, ..., BN by the eNodeB 3 is correct is made by the beamforming-testing unit 15 on the basis of the mechanism of selection of the communication standard used and of the real measurement signals RSRPR (for example, on the basis of the measurement value that, in the real measurement signals RSRPR, indicates the communication beam B1, B2, ..., BN with the best reception quality).

Figure 8:
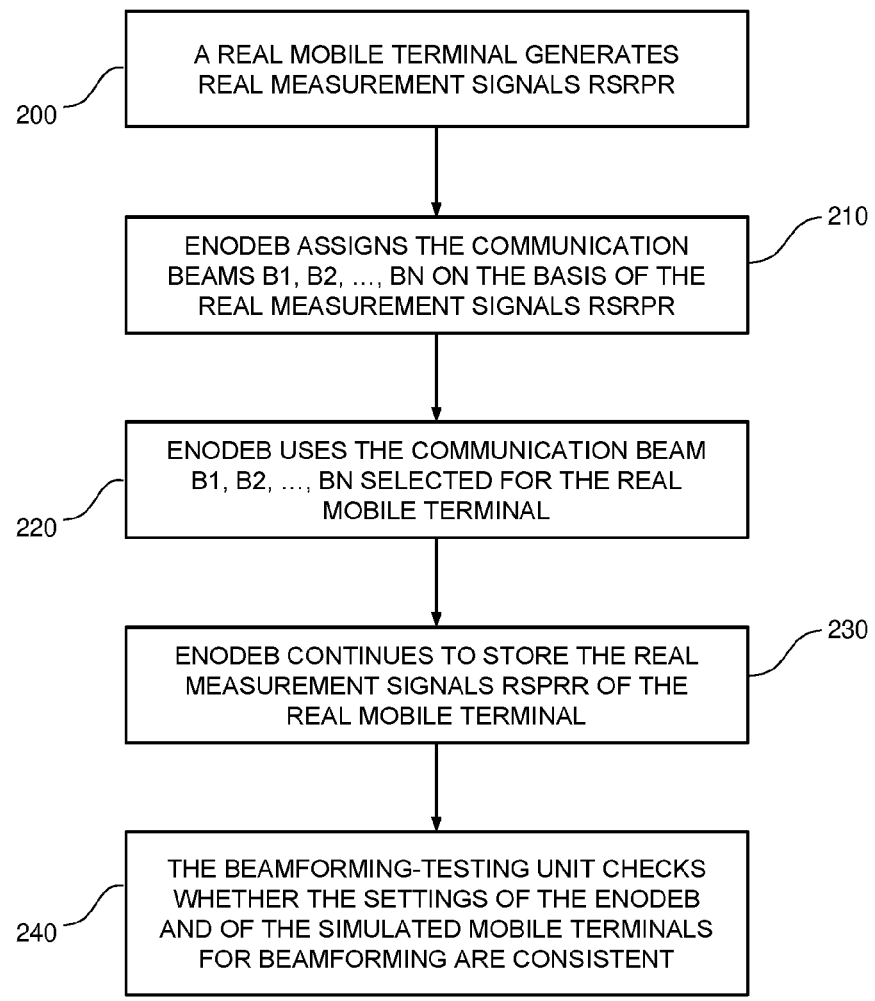
FIG. 8 is a flowchart representing operation of the test apparatus of FIG. 7.

In detail (FIG. 8), the real mobile terminal 26 carries out the beam-acquisition procedure and supplies the real measurement signals RSRPR corresponding to the beam-reference signals BRS1, BRS2, ..., BRSN received (block 200). In this step, the tracking unit 30 stores the real measurement signals RSRPR received and the O&M control signals of the eNodeB 3 that regard beamforming functionality.

Next (block 210), the eNodeB 3 assigns to the real mobile terminal 26 a respective communication beam B1, B2, ..., BN on the basis of the measurement values of the real measurement signals RSRPR received.

The eNodeB 3 then starts to transmit using the communication beam B1, B2, ..., BN assigned to the real mobile terminal 26 (block 220).

After the eNodeB 3 has started transmission over the selected beam, the tracking unit 30 continues to store the real measurement signals RSPRR that the real mobile terminal 26 sends (block 230), and the beamforming-testing unit 15 checks, through the O&M control signals, that the beam effectively used by the eNodeB 3 is consistent with the real measurement signals RSRPS of the real mobile terminal 26 (block 240).

Figure 9:
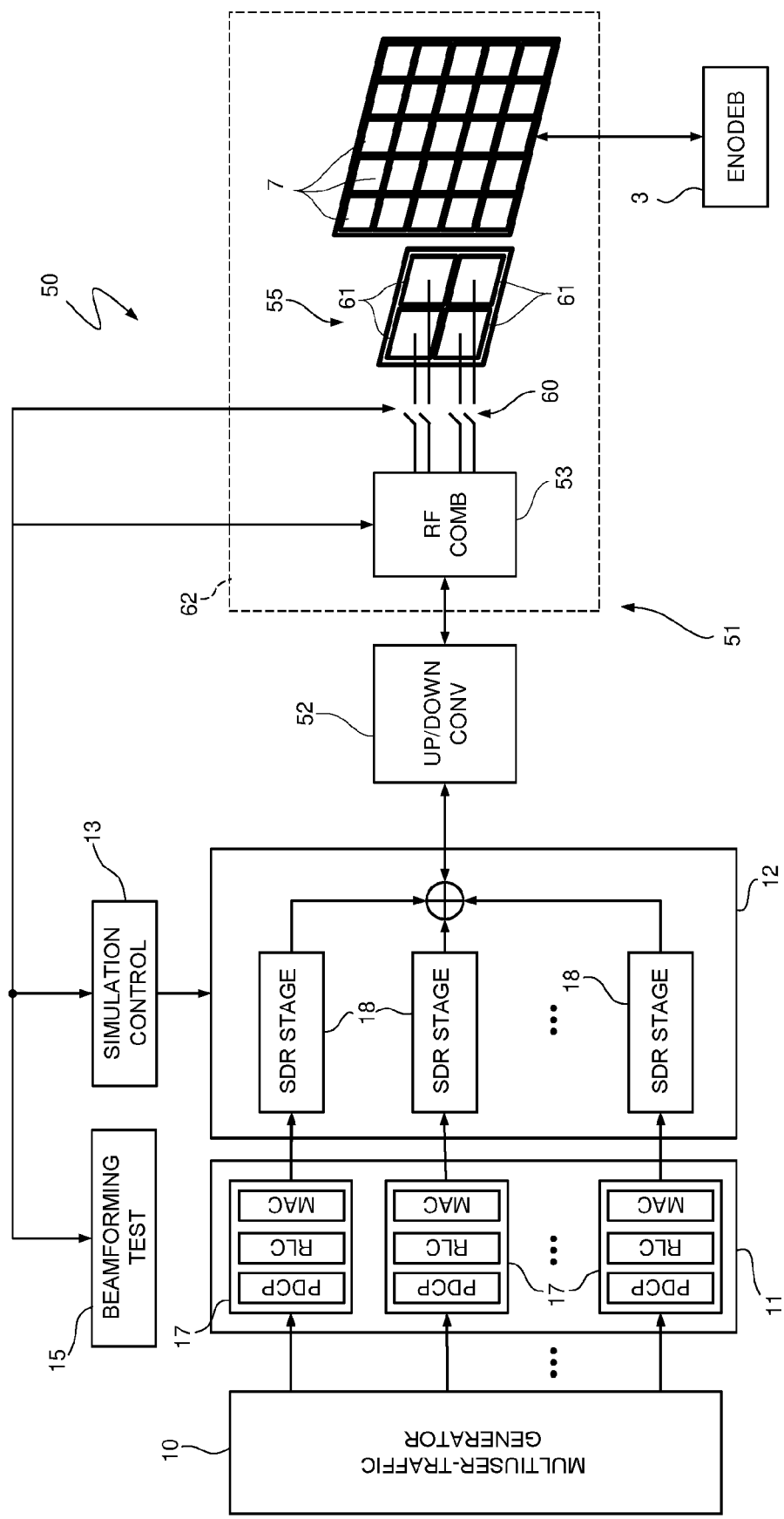
FIG. 9 is a simplified block diagram of a test apparatus for a telecommunication network according to a different embodiment of the present invention, which can be used in the mobile telecommunication network of FIG. 1.
Figure 10:
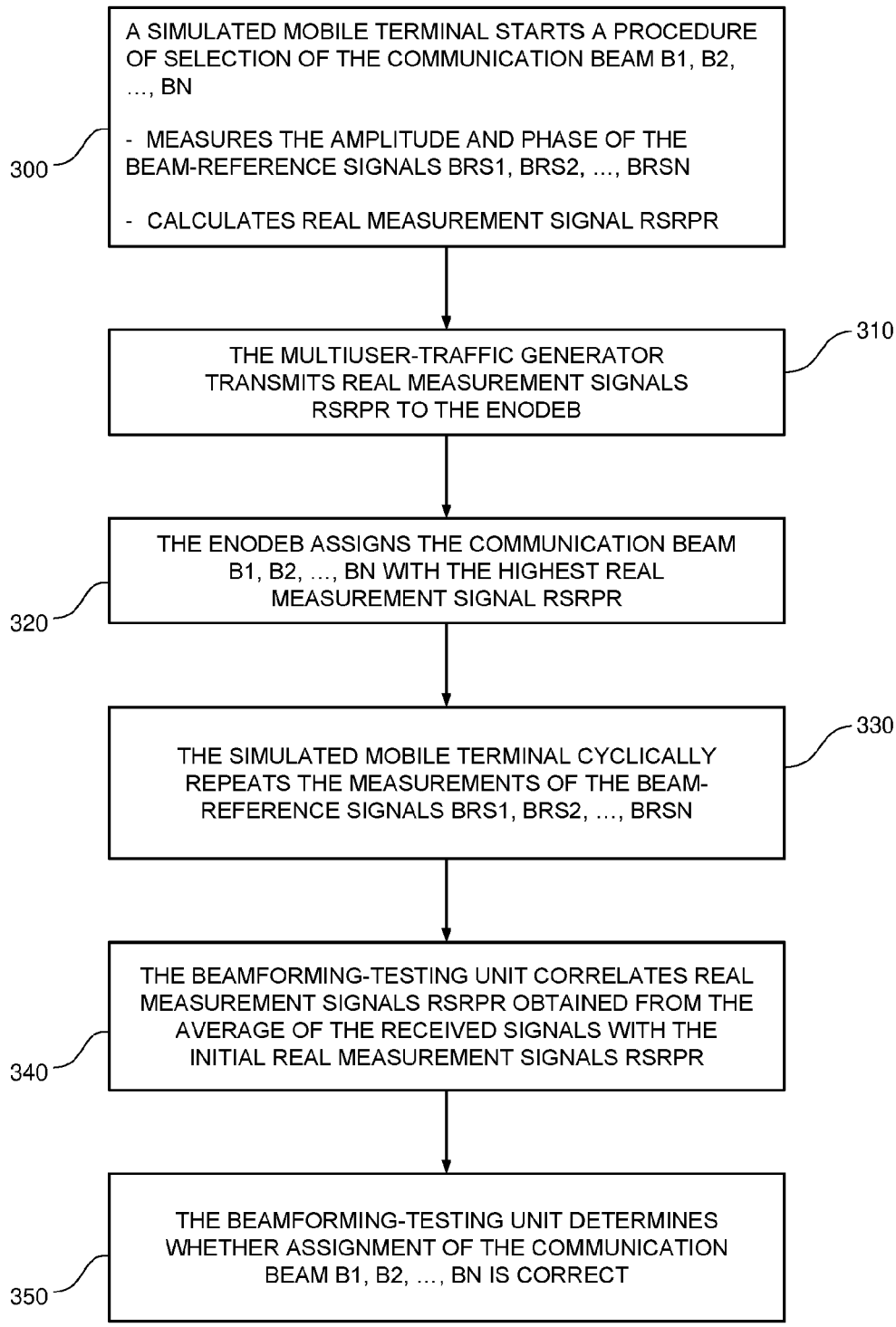
FIG. 10 is a flowchart representing operation of the test apparatus of FIG. 9.

According to a different embodiment of the invention, referred to in FIGS. 9 and 10, the test apparatus, here designated by the number 50, is coupled to the eNodeB 3 in radiofrequency and, in particular, carries out near-field measurements through antennas. Here and in the following, by "near field" it is meant a range of distances from the emitter source that goes from 0 to 2O2/l, where D is the maximum antenna aperture and 1 is the radiation wavelength. The range of distances beyond 2O2/l is defined as "far field".

The test apparatus 50 comprises the multiuser-traffic generator 10, the protocol-simulation unit 11, the physical-layer-simulation unit 12, the simulation-control unit 13, and the beamforming-testing unit 15, substantially as already described with reference to FIG. 1. Moreover, the test apparatus 50 is provided with an RF communication interface 51, to which the test apparatus 50 itself is coupled in communication with the antennas 7 of the eNodeB 3. For simplicity, FIG. 9 illustrates just one RF communication interface 51. This must not, however, be considered limiting in so far as, in a MIMO (Multiple Input Multiple Output) system, the test apparatus may comprise a plurality of RF communication interfaces, which are, for example, substantially identical to one another according to the order of the MIMO system itself.

In one embodiment, the RF communication interface 51 comprises a frequency converter or up/down converter 52, an RF combiner 53, and an array of antennas 55, selectively connectable to the RF combiner 53 through respective switches 60, controlled by the beamforming-testing unit 15.

The array of antennas 55 comprises a plurality of probe antennas 61, for example four, encapsulated within a shielded chamber 62 together with the antennas 7 of the eNodeB 3. The probe antennas 61 are located in respective positions and are used selectively, in rotation, for receiving, inter alia, the beam-reference signals BRS1, BRS2, ..., BRSN. For greater reliability, the measurements obtained by means of the antennas are averaged to define corresponding real measurement signals RSRPR for each communication beam B1, B2, ..., BN. The switches 60 may be operated synchronously with the symbol boundaries of the standard being used (for example, OFDM) so as to prevent loss of information.

With reference to FIG. 10, the multiuser-traffic generator 10 instantiates at least one simulated mobile terminal, which starts a procedure of selection of the communication beam B1, B2, ..., BN, carrying out the following operations (block 300):

the amplitude and phase of the beam-reference signals BRS1, BRS2, ..., BRSN received on the probe antennas 61 are measured; and for each beam-reference signal BRS1, BRS2, ..., BRSN, a real measurement signal RSRPR is calculated from the average of the signals received on the probe antennas 61.

The real measurement signals RSRPR are transmitted by the multiuser-traffic generator 10 to the eNodeB 3 (block 310), which assigns to the instantiated simulated mobile terminal the communication beam B1, B2, ..., BN on the basis of the selection mechanism of the communication standard used (for example, the communication beam B1, B2, ..., BN to which the maximum real measurement signal RSRPR) is associated and starts to transmit using the communication beam B1, B2, ..., BN assigned (block 320).

The simulated mobile terminal receives the downlink communication flow from the eNodeB 3 and cyclically repeats the measurements of the beam-reference signals BRS1, BRS2, ..., BRSN (block 330), and the beamforming-testing unit 15 correlates the real measurement signals RSRPR obtained from the average of the signals received on the probe antennas 61 with the real measurement signals RSRPR calculated initially (block 340). In addition, on the basis of the outcome of the correlation, the beamforming-testing unit 15 determines whether the communication beam B1, B2, ..., BN has been correctly assigned by the eNodeB 3, i.e., whether the communication beam B1, B2, ..., BN effectively used by the eNodeB 3 is the one expected on the basis of the selection mechanism of the communication standard used and of the real measurement signals RSRPR obtained (block 350).

The near-field measurement advantageously makes it possible to arrange very small probe antennas in the immediate vicinity of the emitter antenna of the eNodeB 3 in a shielded chamber, avoiding the complexity, encumbrance, and cost of an anechoic chamber.

Figure 11:
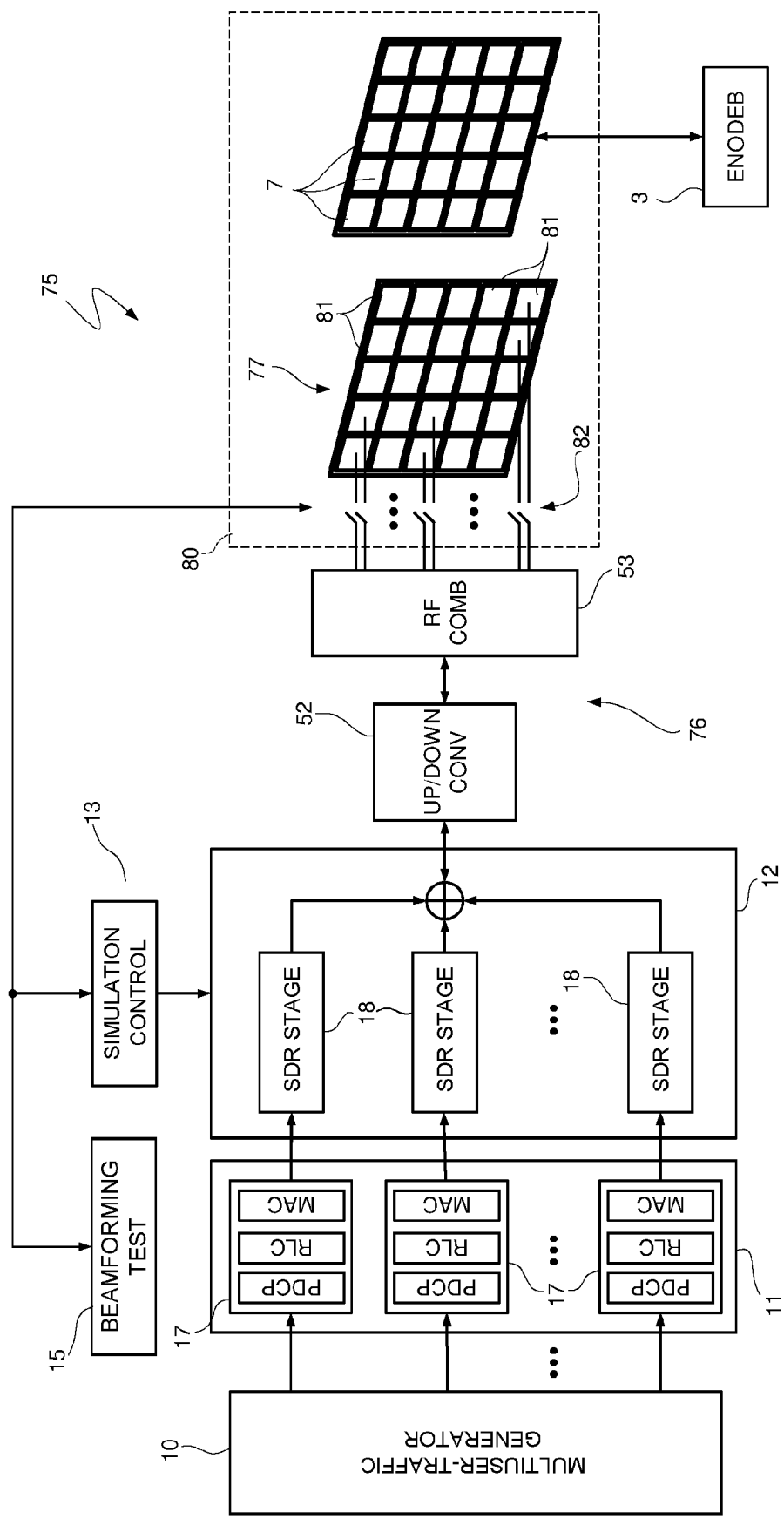
FIG. 11 is a simplified block diagram of a test apparatus for a telecommunication network according to a different embodiment of the present invention, which can be used in the mobile telecommunication network of FIG. 1.

According to a further embodiment, referred to in FIG. 11, the measurement is made in radiofrequency in far-field conditions. The test apparatus, here designated by 75, is coupled to the eNodeB 3 and has substantially the same structure as the test apparatus 50 of FIG. 9. In particular, the test apparatus 75 comprises the multiuser-traffic generator 10, the protocol-simulation unit 11, the physical-layer-simulation unit 12, the simulation-control unit 13, the beamforming-testing unit 15, and an RF communication interface 76, to which the test apparatus 50 is coupled in communication with the system of antennas 7 of the eNodeB 3. In this case, the RF communication interface 76 comprises the up/down converter 52, the RF combiner 53, and an array of antennas 77, set at a far-field distance from the antennas 7 of the eNodeB 3 and enclosed together with these antennas within an anechoic chamber 80. The array of antennas 77 may comprise a number N×M of probe antennas 81 greater than the number of probe antennas of the array of antennas 55 of FIG. 8 (for example, N×M=25 with N=M 5). The probe antennas 81 are selectively connectable to the RF combiner 53 through respective switches 82, controlled by the beamforming-testing unit 15.

The procedure for checking whether the communication beams B1, B2, . . . , BN are used correctly is substantially the same as the one already described with reference to FIG. 10, except for the fact that the average of the signals received may also be made on a subset of the probe antennas 81, selected and connected to the RF combiner 53 according to specific needs.

The test apparatus described advantageously makes it possible to check the correspondence between the communication beam negotiated during the connection between a mobile terminal and an eNodeB and the communication beam effectively used by the eNodeB during communication. In particular, thanks to the test apparatus, it is possible to identify critical aspects at an eNodeB both during project development and in the testing stage during installation, as well as in the case of maintenance operations. The invention hence avoids the risk of the increase in data-transmission capacity associated to the use of beamforming being cancelled out by problems of connections caused by the greater complexity of the systems and procedures.

Finally, it is evident that modifications and variations may be made to the test apparatus and to the method described herein, without thereby departing from the scope of the present invention, as defined in the annexed claims.

The invention claimed is:

1. A test apparatus for testing a mobile telecommunication network, comprising:
   a communication interface for connection to an Evolved Node B (enodeb) of a mobile telecommunication network provided with functionality for transmission according to a plurality of directional communication beams (B1, B2, . . . , BN), the communication interface being configured to receive communication traffic between the enodeb and a mobile terminal coupled in communication to the enodeb; and
   a beamforming-testing unit, configured to receive communication-channel-quality signals corresponding to each communication beam (B1, B2, . . . , BN), the communication-channel-quality signals representing a signal quality received by the mobile terminal, the beamforming-testing unit being configured to check whether communication settings of the enodeb in relation to selection of the plurality of directional communication beams (B1, B2, . . . , BN) are consistent with the communication-channel-quality signals, wherein the communication interface is configured to couple to the enodeb by a base-band connection over optical fibre.

2. The test apparatus according to claim 1, wherein the beamforming-testing unit is configured to check whether the communication beam (B1, B2, . . . , BN) selected by the enodeb for communication with the mobile terminal corresponds to the communication beam (B1, B2, . . . , BN), to which the communication-channel-quality signal is associated, that indicates the highest signal power received at the mobile terminal.

3. The test apparatus according to claim 1, wherein the beamforming-testing unit is configured to extract information regarding selection of the plurality of directional communication beams (B1, B2, . . . , BN) from control signals (O&M) of the enodeb and to check whether communication settings of the enodeb and a communication settings of the mobile terminal in relation to selection of the plurality of directional communication beams (B1, B2, . . . , BN) are consistent on the basis of the control signals (O&M) of the enodeb.

4. The test apparatus according to claim 3, comprising a multiuser-traffic generator configured to produce simulated traffic for a population of simulated mobile terminals, and the communication-channel-quality signals comprise simulated power-measurement signals generated by the multiuser-traffic generator.

5. The test apparatus according to claim 3, wherein the communication interface is configured to couple in communication with the enodeb in radiofrequency and comprises a frequency converter, an RF combiner, and an array of antennas, selectively connectable to the RF combiner through respective switches, controlled by the beamforming-testing unit.

6. The test apparatus according to claim 5, comprising a multiuser-traffic generator configured to produce simulated traffic corresponding to a population of simulated mobile terminals and moreover configured to cyclically:
   measuring an amplitude and a phase of beam-reference signals (BRS1, BRS2, . . . , BRSN) produced by the enodeb and received through the array of antennas; and
   for each beam-reference signal (BRS1, BRS2, . . . , BRSN), calculating the respective communication-channel-quality signal from an average of the signals received through the array of antennas.

7. The test apparatus according to claim 6, wherein the beamforming-testing unit is configured to correlate the communication-channel-quality signals obtained from the average of the signals received through the array of antennas in successive cycles and to determine whether the communication beam (B1, B2, . . . , BN) actually used by the enodeb is the communication beam (B1, B2, . . . , BN) expected on the basis of the communication-channel-quality signals obtained.

8. The test apparatus according to claim 7, further comprising:
   a protocol-simulation unit configured to implement protocol stacks specific at least for one mobile telecommunication standard, wherein the protocol stacks are defined by a set of state machines that implement respective protocol layers; and
   a physical-layer-simulation unit configured to define a plurality of SDR modules, which carry out a conversion into symbols, according to a modulation scheme, of a bitstream originating from the mobile terminal and carry out an amplitude and phase modulation of sub-carriers assigned to the mobile terminal on a basis of sequences of symbols to be transmitted.

9. A method for testing a mobile telecommunication network, the method comprising:
   receiving, through a communication interface, communication traffic between an Evolved Node B (enodeb) of a mobile telecommunication network provided with functionality for transmission according to a plurality of directional communication beams (B1, B2, . . . , BN) and a mobile terminal coupled in communication to the enodeb;

receiving communication-channel-quality signals corresponding to each communication beam (B1, B2, ..., BN), the communication-channel-quality signals representing a signal quality received by the mobile terminal;

checking whether communication settings of the enodeb in relation to selection of the plurality of directional communication beams (B1, B2, ..., BN) are consistent with the communication-channel-quality signals by checking whether the communication beam (B1, B2, ..., BN) selected by the enodeb for communication with the mobile terminal corresponds to the communication beam (B1, B2, ..., BN), to which the communication-channel-quality signal is associated, that indicates the highest signal power received at the mobile terminal;

establishing a base-band connection with the enodeb;

extracting information regarding selection of the plurality of directional communication beams (B1, B2, ..., BN) from control signals (O&M) of the enodeb; and checking whether the communication settings of the enodeb and communication settings of the mobile terminal in relation to selection of the plurality of directional communication beams (B1, B2, ..., BN) are consistent on the basis of the control signals (O&M) of the enodeb.

10. The method according to claim 9, further comprising simulating a population of mobile terminals, wherein the communication-channel-quality signals comprise simulated power-measurement signals.

11. The method according to claim 9, further comprising: establishing a radiofrequency connection with the enodeb; and receiving beam-reference signals (BRS1, BRS2, ..., BRSN) produced by the enodeb through an array of antennas.

12. The method according to claim 11, further comprising simulating a population of mobile terminals, and cyclically:

measuring an amplitude and phase of the beam-reference signals (BRS1, BRS2, ..., BRSN) received through the array of antennas; and for each beam-reference signal (BRS1, BRS2, ..., BRSN), calculating the respective communication-channel-quality signal from an average of the signals received through the array of antennas.

13. The method according to claim 12, further comprising:

correlating the communication-channel-quality signals obtained from the average of the signals received from the array of antennas in successive cycles; and determining whether the communication beam (B1, B2, ..., BN) effectively used by the enodeb is the communication beam (B1, B2, ..., BN) expected on basis of the communication-channel-quality signals obtained.

14. The method according to claim 13, further comprising arranging the array of antennas in a shielded chamber with antennas of the enodeb at a near-field distance.

15. The method according to claim 13, further comprising arranging the array of antennas in an anechoic chamber, with antennas of the enodeb at a far-field distance.

* * * * *

UNITED STATES PATENT AND TRADEMARK OFFICE
CERTIFICATE OF CORRECTION

PATENT NO. : 11,337,088 B2
APPLICATION NO. : 16/765517
DATED : May 17, 2022
INVENTOR(S) : Enrico Bendinelli and Paolo Angelo Maria Marini It is certified that error appears in the above-identified patent and that said Letters Patent is hereby corrected as shown below:

On the Title Page

Column 1, under item (72), after 2nd Inventor "Paolo Angelo Maria Marini", please delete "Sauze d'Olux (IT)" and insert --Sauze d'Oulx (IT)--.

Column 2, under item (56), "Other Publications", please delete "1 B2018" and insert --IB2018--.

In the Specification

Column 1, Line 15, please delete "M2018" and insert --IB2018--.

Signed and Sealed this
Twelfth Day of November, 2024

Katherine Kelly Vidal
*Director of the United States Patent and Trademark Office*